United States Patent
Urano et al.

(10) Patent No.: US 6,278,050 B1
(45) Date of Patent: Aug. 21, 2001

(54) METHOD OF PRODUCING SINTERED BODY OF MATERIAL FOR THERMOELECTRIC ELEMENT

(75) Inventors: Yoji Urano, Ikeda; Kazuo Kamada, Hirakata; Hirokazu Yoshioka, Osaka; Kentaro Kobayashi, Sijonawate, all of (JP)

(73) Assignee: Matsushita Electric Works, Ltd., Kadoma (JP)

( * ) Notice: Subject to any disclaimer, the term of this patent is extended or adjusted under 35 U.S.C. 154(b) by 0 days.

(21) Appl. No.: 09/602,017

(22) Filed: Jun. 23, 2000

(30) Foreign Application Priority Data

Jun. 25, 1999 (JP) .................................................. 11-180190

(51) Int. Cl.$^7$ .................................................. H01L 35/34
(52) U.S. Cl. ............................................ 136/201; 136/203
(58) Field of Search ................................. 136/201, 203, 136/238, 240, 205

(56) References Cited

FOREIGN PATENT DOCUMENTS 9-321357    12/1997   (JP) .

*Primary Examiner*—Kathryn Gorgos
*Assistant Examiner*—Thomas H Parsons
(74) *Attorney, Agent, or Firm*—Oblon, Spivak, McClelland, Maier & Neustadt, P.C.

(57) ABSTRACT

A sintered body of a material for thermoelectric element having excellent thermoelectric performance and mechanical strength can be produced by the following method. A block of the material for thermoelectric element is provided. The block has an electric-current passing direction, in which electricity is supplied to obtain a desired thermoelectric performance of the thermoelectric element. The block is encased in an elongate capsule such that the electric-current passing direction of the block is substantially agreement with an axial direction of the capsule. After degassing the capsule, a forming operation for reducing a cross section perpendicular to the axial direction of the capsule is performed to obtain a formed capsule having a green compact of the block crushed by the forming operation therein. A heat treatment is then performed to sinter the green compact in the formed capsule. Finally, the resultant sintered body is removed from the formed capsule. This method is preferably used to manufacture a thermoelectric module that is a temperature control device using the Peltier effect.

12 Claims, 12 Drawing Sheets

METHOD OF PRODUCING SINTERED BODY OF MATERIAL FOR THERMOELECTRIC ELEMENT

BACKGROUND OF THE INVENTION

1. Field of the Invention

The present invention relates to a method of producing a sintered body of a material for thermoelectric element, which is preferably used to prepare thermoelectric elements for a thermoelectric module that is a temperature control device using the Peltier effect.

2. Disclosure of the Prior Art

As shown in FIGS. 12A and 12B, a conventional thermoelectric module 100 is provided with an arrangement of N-type and P-type semiconductor elements 110, 120 as thermoelectric elements, which are arranged in a matrix manner such that each of the N-type semiconductor elements 110 is disposed adjacent to the P-type semiconductor element 120 through a required space, upper electrodes 130 disposed on a top surface of the arrangement to connect between adjacent semiconductor elements 110 and 120 according to a first circuit pattern, lower electrodes 140 disposed on a bottom surface of the arrangement to connect between adjacent semiconductor elements 110 and 120 according to a second circuit pattern different from the first circuit pattern, and ceramic plates 150 such as sintered alumina plates bonded to the upper and lower electrodes 130 and 140.

For example, as shown in FIG. 12B, when direct current is supplied to the thermoelectric module 100, each of the upper electrodes 130 has the flow of electricity from N-type semiconductor element 110 toward the P-type semiconductor element 120, and on the other hand each of the lower electrodes 140 has the flow of electricity from the P-type semiconductor element 120 toward the N-type semiconductor element 110. At this time, the upper electrodes 130 absorb heat from the surroundings through the ceramic plate 150, and the lower electrodes 140 radiate heat to the surroundings through the ceramic plate 150. Therefore, the thermoelectric module 100 works as a kind of heat pump for pumping heat from one side to the opposite side thereof, which is usually known as the Peltier effect. According to this principle, it is possible to use the thermoelectric module 100 as a temperature control device for electronic parts or circuit boards.

The thermoelectric elements 110, 120 can be produced according to the following method disclosed in Japanese Patent Early Publication [KOKAI] No. 9-321357. That is, as shown in FIG. 13, an ingot of a material for thermoelectric element is ball-milled in a non-oxidation atmosphere to obtain a powder thereof After charging the powder into a capsule made of a metal material such as aluminum, the degassing of the capsule is performed to obtain a billet for extrusion. As shown in FIG. 14, an extrusion step is then performed by use of an extrusion die 70 to reduce a diameter of the billet 72. In FIG. 14, the numeral 76 designates the powder of the thermoelectric-element material charged in the capsule 74. Next, a heat treatment is performed to sinter the powder in the worked billet. By removing a resultant sintered body from the capsule, a thin rod of the sintered body of the thermoelectric-element material is obtained.

In the above method, since the ingot is previously ball-milled, it is possible to reduce the segregation of alloying elements in the ingot, i.e., nonuniform distribution of alloying elements in the ingot. As a result, variations in thermoelectric performance and mechanical properties of the thermoelectric elements decrease. In addition, as compared with a case that the thermoelectric elements are directly cut from the ingot, it is possible to remarkably reduce the occurrence of cracks or chipping of the thermoelectric elements. Moreover, since the mechanical strength of the thermoelectric elements is improved by the heat treatment, the yields of the thermoelectric-element material increase.

By the way, the heat-pump performance of the thermoelectric module 100 highly depends on the thermoelectric performance of the thermoelectric elements 110, 120. The thermoelectric performance can be improved by providing the uniform distribution of alloying elements in the ingot, reducing amounts of impurities trapped in the thermoelectric element, and/or increasing a degree of orientation of a specified crystal plane of the thermoelectric-element material. In the above-described method, since the ingot is ball-milled, the uniform distribution of alloying elements can be achieved. However, the amounts of impurities in the obtained powder of the thermoelectric-element material generally increase. Therefore, there is a limitation in improvement of the thermoelectric performance.

On the other hand, when the degree of orientation of the specified crystal plane that is the so-called "C" crystal plane of the thermoelectric-element material is increased, the thermoelectric performance can be remarkably improved. That is, when direct current is supplied to the thermoelectric element along the crystal orientation, the improved thermoelectric performance is obtained. In the above method, since the ingot is ball-milled, the powder of the thermoelectric-element material is in random orientations of the "C" crystal plane. Although the degree of orientation of the "C" crystal plane can be improved to some extent by performing the extrusion step to the capsule having the powder therein, it is not sufficient to obtain excellent thermoelectric performance.

SUMMARY OF THE INVENTION

A primary object of the present invention is to provide a method of producing a sintered body of a material for thermoelectric element having excellent thermoelectric performance and mechanical strength, which is preferably used to manufacture a thermoelectric module that is a temperature control device using the Peltier effect. That is, the sintered body is produced by the following method. A block of the material for thermoelectric element is provided. The block has an electric-current passing direction, in which electricity is supplied to obtain a desired thermoelectric performance of the thermoelectric element. The block is encased in an elongate capsule such that the electric-current passing direction of the block is substantially agreement with an axial direction of the capsule. After degassing the capsule, a forming operation for reducing a cross section perpendicular to the axial direction of the capsule is performed to obtain a formed capsule having a green compact of the block crushed by the forming operation therein. A heat treatment is then performed to sinter the green compact in the formed capsule. Finally, the sintered body is removed from the formed capsule.

In the above method of the present invention, it is preferred that the capsule is made of a metal material having a lower coefficient of linear expansion than the material for thermoelectric element over a temperature range for the heat-treatment. In this case, it is possible to effectively perform the heat-treatment, as explained in detail later.

In the above method of the present invention, it is preferred that the forming operation is performed in a stepwise manner to obtain the formed capsule having a desired cross section. In this case, it is preferred to perform an annealing treatment during the forming operation. The annealing treatment is effective to safely finish the forming operation without a failure of the capsule.

A further object of the present invention is to provide a method of producing a sintered body of a material for thermoelectric element having excellent thermoelectric performance and mechanical strength, which is preferably used to manufacture a thermoelectric module having improved heat-pump performance. That is, the sintered body is produced by the following method. An ingot of the material for thermoelectric element prepared by means of unidirectional solidification is provided. The ingot is encased in an elongate capsule such that a direction of the solidification of the ingot is substantially agreement with an axial direction of the capsule. After degassing the capsule, a forming operation for reducing a cross section perpendicular to the axial direction of the capsule is performed to obtain a formed capsule having a green compact of the ingot crushed by the forming operation therein. A heat treatment is then performed to sinter the green compact in the formed capsule. Finally, the sintered body is removed from the formed capsule.

Alternatively, the sintered body may be produced by the following method. That is, a pre-sintered body having an axial direction, in which a specific crystal plane of the material for thermoelectric element is substantially oriented, is prepared. It is preferred that the pre-sintered body is prepared by grinding an ingot of the material for thermoelectric element prepared by means of unidirectional solidification to obtain a powder thereof, and hot-pressing the powder in a non-oxidation atmosphere. Next, the pre-sintered body is encased in an elongate capsule such that the press direction of the pre-sintered body is agreement with an axial direction of the capsule. After degassing the capsule, a forming operation for reducing a cross section perpendicular to the axial direction of the capsule is performed in a stepwise manner to obtain a formed capsule having a green compact of the pre-sintered body crushed by the forming operation therein. A heat treatment is then performed to sinter the green compact in the formed capsule. Finally, the sintered body is removed from the formed capsule.

Further features of the present invention and advantages brought thereby will be understood in detail from the following descriptions of the preferred embodiments of the present invention referring to the attached drawings.

BRIEF DESCRIPTION OF THE DRAWINGS

In FIGS. 4A and 4B.

DETAIL DESCRIPTION OF THE PREFERRED EMBODIMENTS

The preferred embodiments of the present invention are explained below in detail referring to the attached drawings.

First Embodiment

Figure 1:
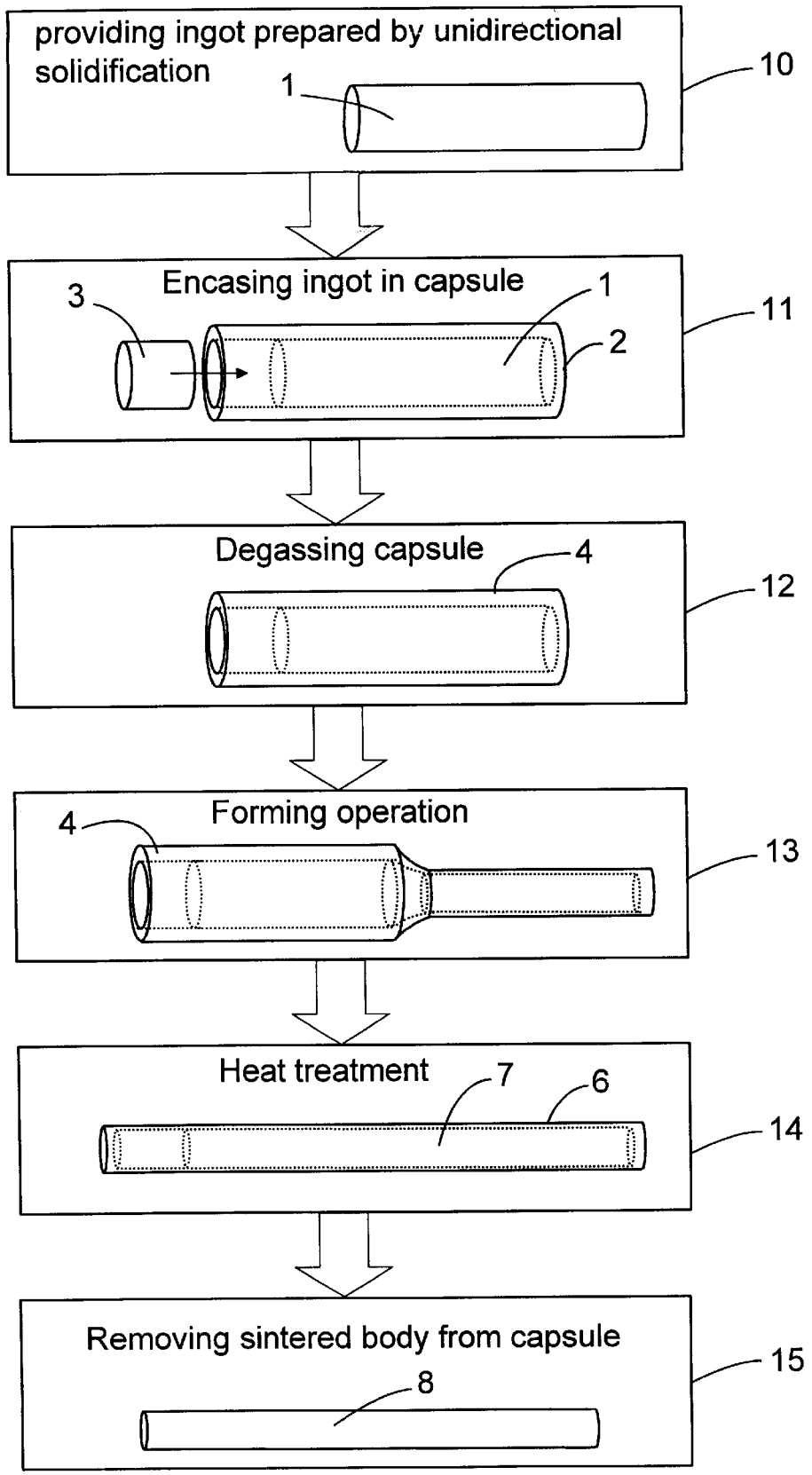
FIG. 1 is a flowchart of a method of producing a sintered body of a material for thermoelectric element according to a first embodiment of the present invention.

A sintered body of a material for thermoelectric element can be produced by the following method according to the first embodiment of the present invention, as shown in the flowchart of FIG. 1.

STEP 10

In the step 10, an ingot bar 1 of a material for thermoelectric element prepared by means of unidirectional solidification is provided. As the material for thermoelectric element, for example, it is possible to use $Bi_2Te_3$ for an N-type thermoelectric element or $Sb_2Te_3$ for a P-type thermoelectric element. The unidirectional solidification is known as a technique of solidifying a crystalline material under controlled conditions such that a desired crystal plane is substantially oriented in the solidification direction. The material for thermoelectric element is a brittle compound, and has the so-called "C" crystal plane that is a cleavage plane. The ingot bar 1 used in the present embodiment is characterized in that the "C" crystal plane is substantially oriented in the solidification direction, which is in agreement with an axial direction of the ingot bar.

As described before, the heat-pump performance of a thermoelectric module highly depends on the thermoelectric performance of the thermoelectric elements used. The level of thermoelectric performance changes according to a direction of electric current supplied to the thermoelectric element. A high level of the thermoelectric performance is obtained when the direction of electric current supplied to the thermoelectric element is in agreement with the direction of "C" crystal plane. Therefore, as a degree of orientation of the "C" crystal plane in thermoelectric element is higher, the improved thermoelectric performance can be attained. The ingot bar 1 used in the present embodiment is prepared by the unidirectional solidification such that the "C" crystal plane (cleavage plane) of the material for thermoelectric element is substantially oriented in the axial direction of the ingot bar 1, i.e., the solidification direction of the ingot bar. This means that the ingot bar 1 has an electric-current passing direction, in which electricity is supplied to obtain excellent thermoelectric performance of the thermoelectric element. A marketed ingot prepared by the unidirectional solidification to satisfy the above-mentioned conditions to the above manner may be used in this embodiment.

STEP 11

Figure 2:
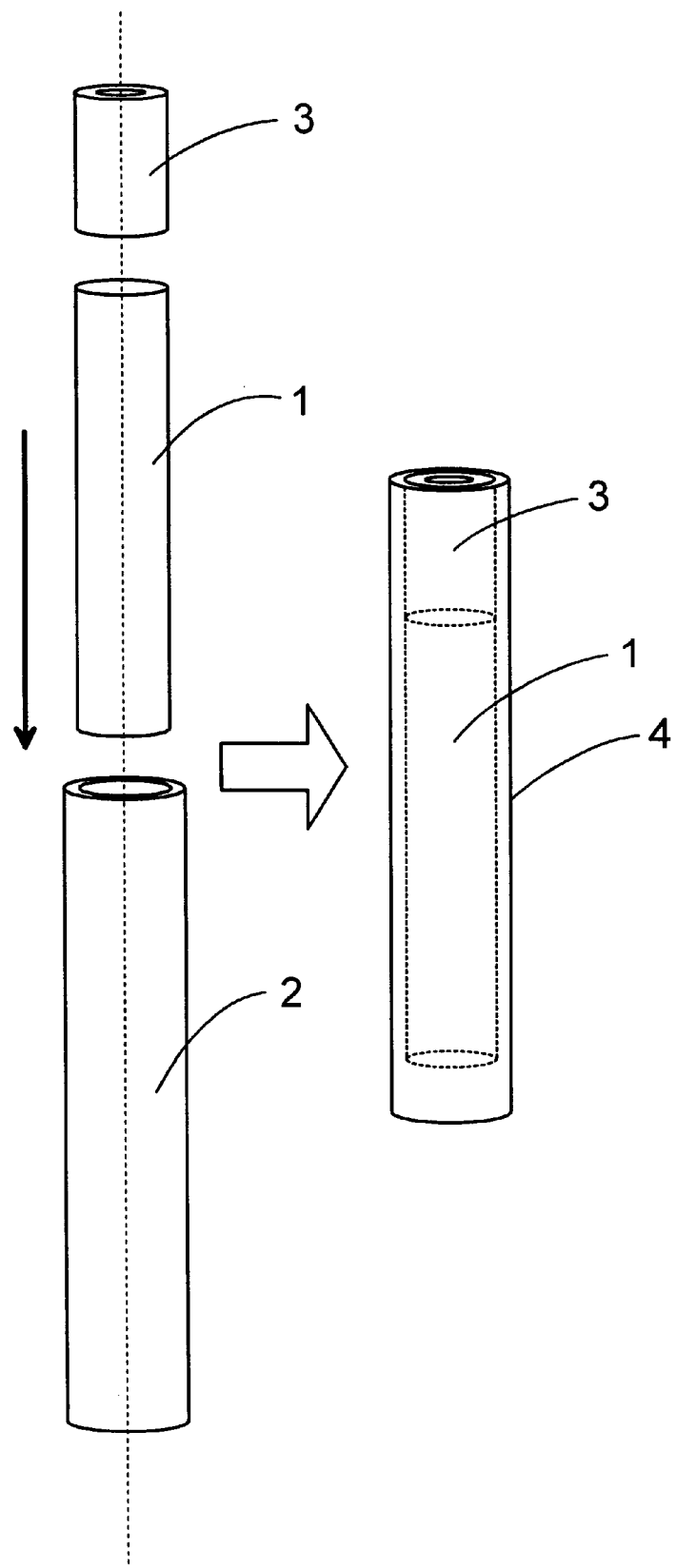
FIG. 2 is a perspective view showing a step of encasing an ingot bar into a capsule of the present invention.
Figure 3:
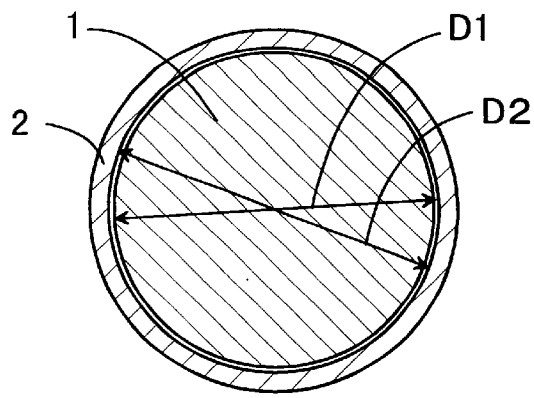
FIG. 3 is a cross-sectional view of the ingot bar encased in the capsule.

In the step 11, the ingot bar 1 is encased in an elongate capsule 2 such that the solidification direction of the ingot is substantially agreement with an axial direction of the capsule, as shown in FIG. 2. As the capsule 2, it is preferred to use a capsule made of a metal material such as aluminum, iron or steels. When the ingot bar 1 is of a round-bar shape, it is preferred to configure the capsule 2 such that the ingot bar fits into the capsule. In other words, it is preferred to configure the capsule such that a diameter of the ingot bar 1 is slightly smaller than an inner diameter of the capsule 2. For example, as shown in FIG. 3, when the diameter D1 of the ingot bar 1 is 7 mm with a tolerance of +0.000, –0.012 mm, it is preferred that the inner diameter D2 of the capsule 2 is 7 mm with a tolerance of +0.012, –0.000.

Figure 4A:
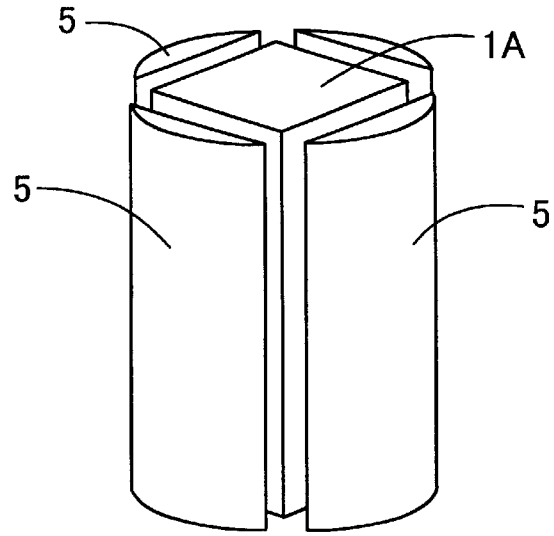
FIG. 4A is a perspective view of a cylinder assembly composed of a single ingot bar and spacers.
Figure 4B:
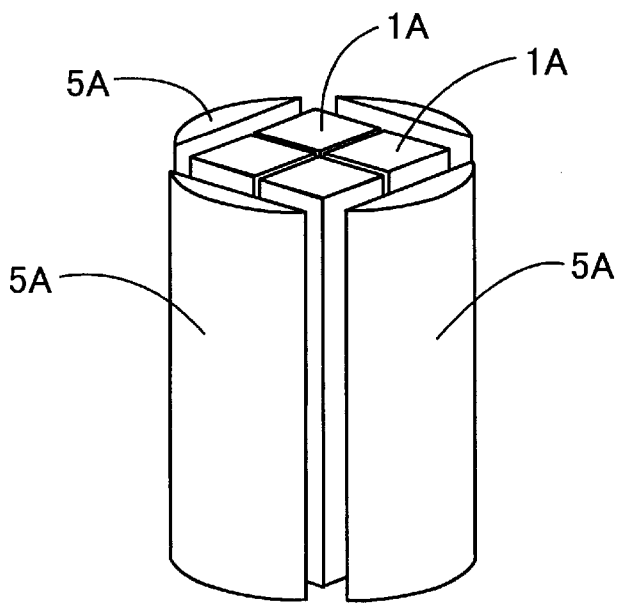
FIG. 4B is a perspective view of a cylinder assembly composed of plural ingot bars and spacers.

On the other hand, as shown in FIG. 4A, when using an ingot bar 1A having a rectangular-bar shape, it is preferred that the capsule 2 is configured such that a cylinder assembly composed of the single ingot bar 1A and four spacers 5 fits into the capsule. In addition, when the capsule 2 is configured such that a large cylinder assembly composed of a plurality of rectangular ingot bars 1A and four spacers 5A fits into the capsule, as shown in FIG. 4B, a sintered body having a larger diameter of the material for thermoelectric element can be produced by the present method. It is preferred that the spacers 5, 5A are made of the same material as the capsule 2. Thus, one of the important features of the present invention is to charge the ingot bar 1, 1A of the material for thermoelectric element in the capsule 2 without grinding the ingot bar.

STEP 12

After covering the capsule 2 with a lid 3, the degassing of the capsule is performed to obtain a billet 4 for a forming operation described below.

STEP 13

Figure 5:
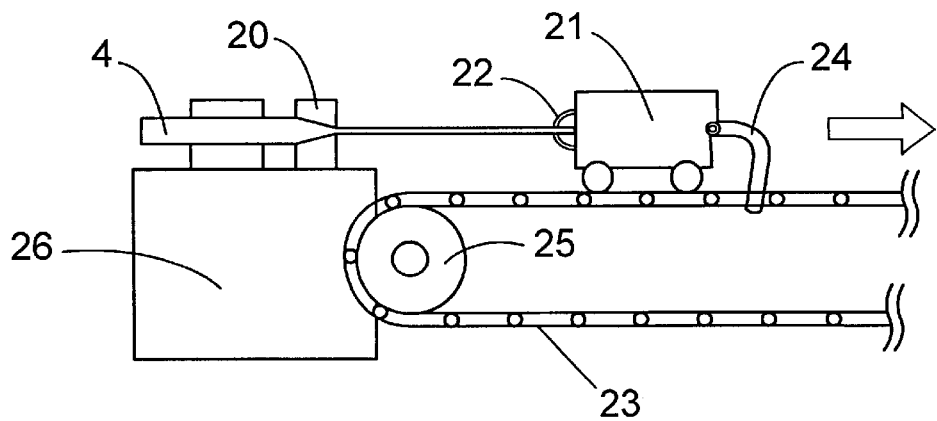
FIG. 5 is a schematic view of a drawn bench.

Next, the forming operation is performed to the billet 4 to reduce the cross section perpendicular to the axial direction of the billet. As the forming operation it is preferred to select bar drawing, rolling or swaging. For example, the bar drawing can be performed by use of a draw bench, as shown in FIG. 5. The draw bench is provided with a drawing die 20, drawing car 21 with a chuck 22 for chucking a top end of the billet 4, chain 23 for pulling the drawing car in a drawing direction, and a hook 24 used to connect the drawing car with the chain. The chain 23 is driven by a sprocket wheel 25 connected to an electric motor (not shown) through a reduction gearing (not shown). The numeral 26 designates a supporting table for the drawing die. When performing the drawing operation in a stepwise manner to obtain a desired cross section of the billet, it is possible to provide an accuracy of the diameter of the formed billet in the longitudinal direction within ±0.02 mm.

Figure 6A:
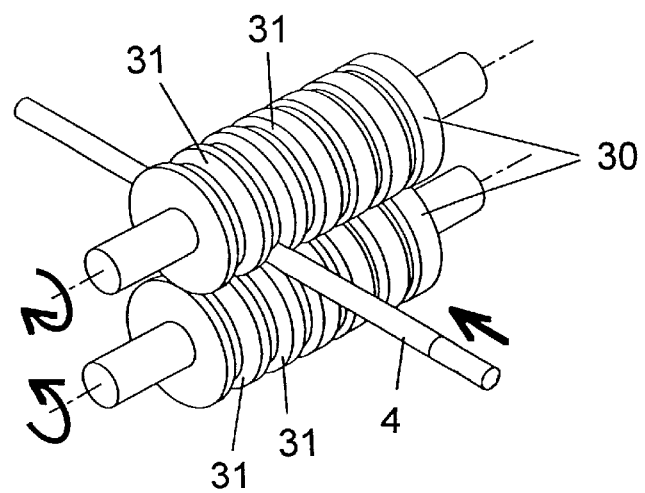
FIGS. 6A and 6B are perspective and front views of a pair of rollers for rolling, respectively.
Figure 6B:
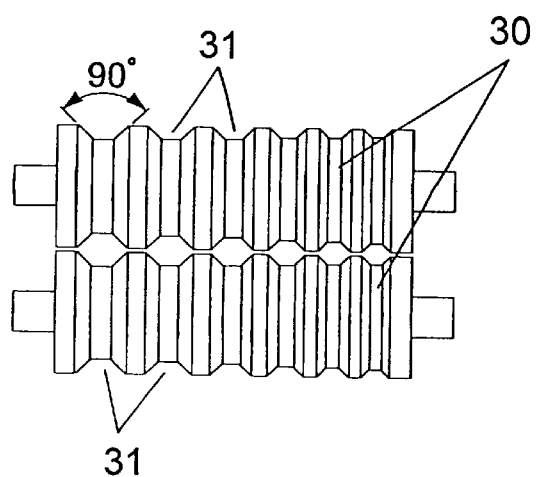

On the other hand, a pair of rollers each having different grooves in width and depth sizes can be used to perform the rolling. For example, as shown in FIGS. 6A and 6B, a roller 30 has 6 different grooves 31 formed such that the width and depth sizes of the grooves are gradually reduced from one end to the opposite end of the roller, i.e., from the left side toward the right side of the roller 30 shown in FIG. 6B. Each of the grooves 31 has an aperture angle of 90°. The billet 4 is inserted into a rolling space defined between the grooves 31 with the same width and depth of the rollers 30 to reduce the cross section of the billet, as shown in FIG. 6A. Therefore, the cross section of the billet 4 can be gradually reduced in a stepwise manner, i.e., in 6 steps, by use of these rollers 30. Thus, when performing the rolling operation in the stepwise manner to obtain a desired cross section of the billet, it is possible to provide an accuracy of the diameter of the formed billet in the longitudinal direction within ±0.02 mm.

Figure 7A:
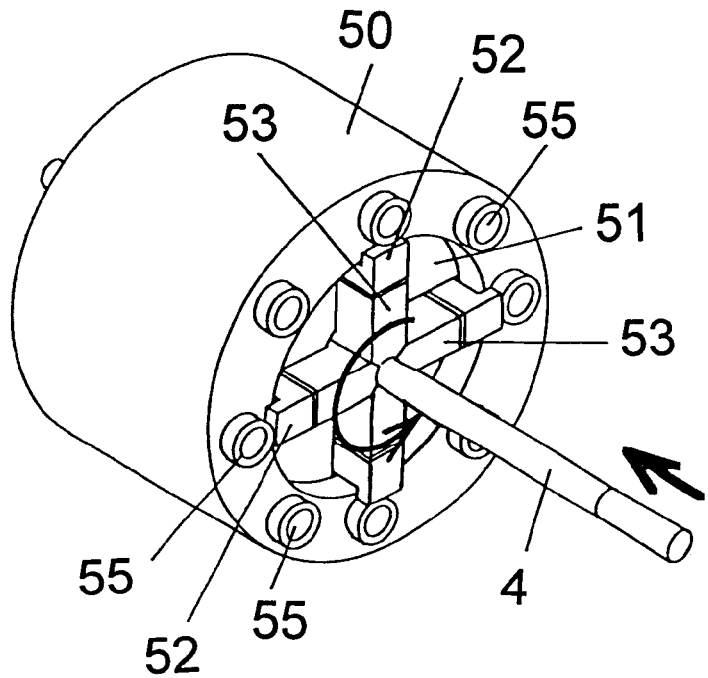
FIGS. 7A and 7B are perspective and front views of a swaging machine.
Figure 7B:
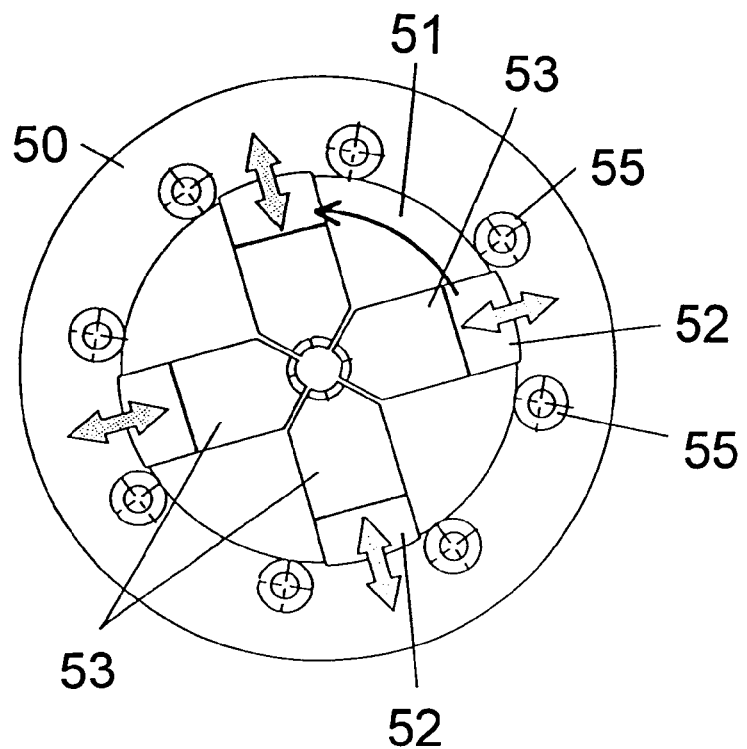

In addition, a swaging machine 50 can be used to perform the swaging, as shown in FIGS. 7A and 7B. The swaging machine 50 comprises a spinning body 51, four sets of backer 52 and die 53 which are slidably supported in the radial direction by the spinning body, and cam followers 55 disposed at the circumference of the axis of the spinning body with a constant angular interval. A swaging operation is performed by inserting the billet 4 into a swaging space surrounded by the top ends of the four dies 53, while rotating the spinning body 51, so that the cross section of the billet is reduced. That is, when the spinning body 51 rotates, each of the four sets of the backer 52 and die 53 moves in the radial direction of the spinning body by centrifugal force to spread the swaging space. However, the cam followers 55 interfere with the movements of the backer 52 and die 53, so that the four sets of the backer and die move in the radial direction toward the axis of the spinning body to narrow the swaging space. During the swaging operation, the top ends of the dies 53 successively hit the billets 4 inserted in the swaging space to reduce the cross section of the billet. By exchanging the dies 53, the cross section of the billet 4 can be gradually reduced in a stepwise manner. When using the swaging as the forming operation, it is possible to provide an accuracy of the diameter of the formed billet in the longitudinal direction within ±0.1 mm.

In the present invention, the capsule 2 made of the metal material is plastically deformed by the forming operation. However, since the ingot bar 1 is made of the brittle material, the ingot bar can not follow the plastic deformation of the capsule, so that the ingot bar is crushed in the capsule. In addition, since the cross section of the capsule is reduced by the forming operation, the crushed ingot bar receives compression, so that a green compact of the crushed ingot bar is obtained in the formed capsule. As described above, the material for thermoelectric element easily breaks along the cleavage plane, i.e., the orientation of the "C" crystal plane. Therefore, even when the ingot bar is crushed in the capsule by the forming operation, the green compact of the crushed ingot bar can substantially maintain the orientation of the "C" crystal plane. It is preferred to perform the forming operation at a feed rate of the billet less than 10 m/min.

It is preferred that the forming operation is performed to the billet 4 in a stepwise manner, i.e., plural stages, to obtain a desired cross section of the billet. When a total reduction ratio ($\alpha$) of cross section of the billet is high, which is defined as a ratio of the cross section ($S_f$) of the billet measured after all of the stages of the forming operation are performed to the cross section ($S_0$) of the billet measured before the forming operation, the occurrence of a failure of the capsule due to work hardening may become a problem. For example, the forming operation of the present invention can be performed until the total reduction ratio ($\alpha$) of cross section reaches about 0.33 ($S_f/S_0=1/3$). In such a case, it is effective to perform an annealing treatment to the billet 4 at an adequate timing during the forming operation. The timing and conditions of the annealing treatment can be optionally determined according to the kinds of the capsule material, and the conditions of the forming operation, e.g., the number and kinds of the forming operation, the reduction ratio of cross section and the forming speed such as drawing speed. As an example, in case of using an aluminum capsule, it is preferred to carry out the annealing treatment under the conditions of about 300° C. and about 10 minutes every time a reduction ratio ($\beta$) of cross section of the billet, which is defined as the ratio of the cross section ($S_{n2}$) of the billet measured after at least one stage of the forming operation is performed to the cross section ($S_{n1}$) of the billet measured before the at least one stage is performed, reaches about 0.9 ($S_{n2}/S_{n1}$=9/10) during the forming operation.

Figure 8:
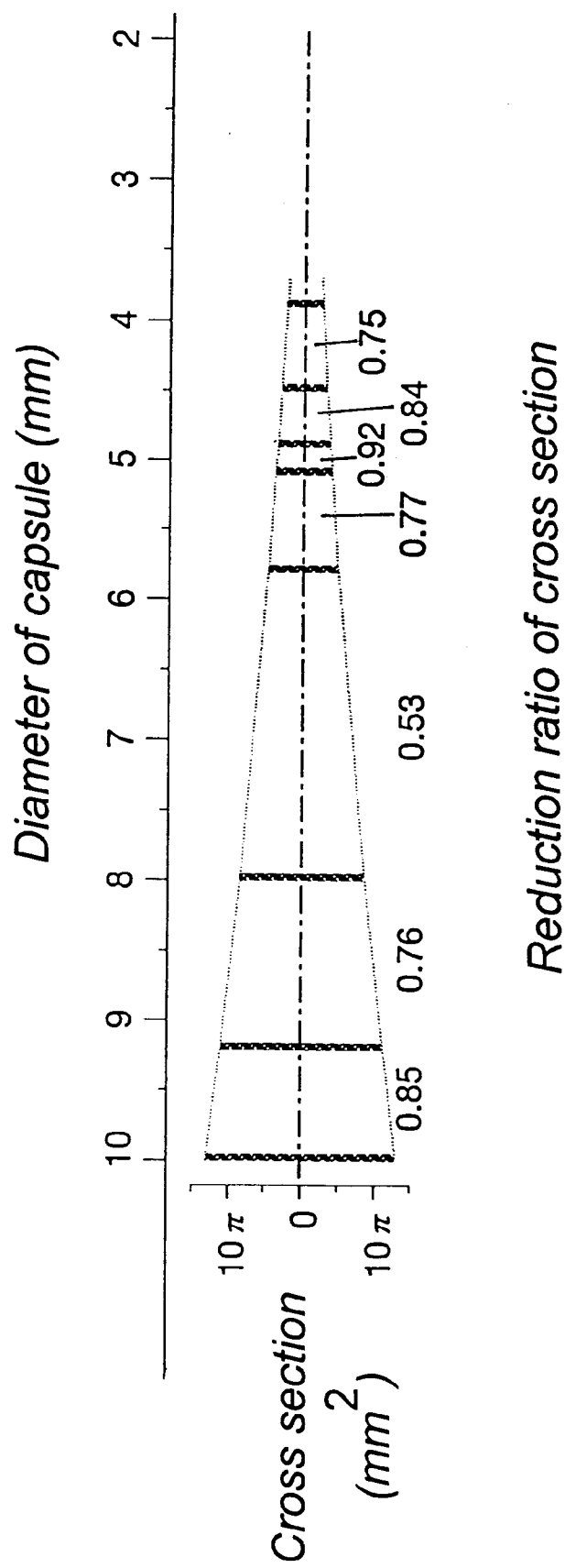
FIG. 8 is a diagram showing results of a first experiment described in the first embodiment.

The followings are experimental results of the forming operation of the present invention. In a first experiment, a swaging operation was performed in a stepwise manner to reduce the cross section of a billet having the original diameter of 10 mm and the total length of 100 mm. The wall thickness and inner diameter of the capsule are 1.5 mm and 7 mm, respectively. The swaging operation has seven stages having different reduction ratios of cross section, as shown in FIG. 8. The diameter of the billet was successively reduced from 10 mm to 9.2 mm, 8.0 mm, 5.8 mm, 5.1 mm, 4.9 mm, 4.5 mm, and 3.9 mm by the seven stages of the swaging operation. For example, the reduction ratio of the first stage is 0.85, which is calculated by determining the ratio of the cross section ($S_{n2}$=4.6×4.6×$\pi$=66.44) of the billet measured after the first stage of the swaging operation to the cross section ($S_{n1}$=5.0×5.0×$\pi$=78.50) of the billet measured before the first stage. The total length of the billet, the wall thickness and inner diameter of the capsule measured after the seven stages of the swaging operation are 548.0 mm, 0.59 mm and 2.73 mm, respectively.

Figure 9:
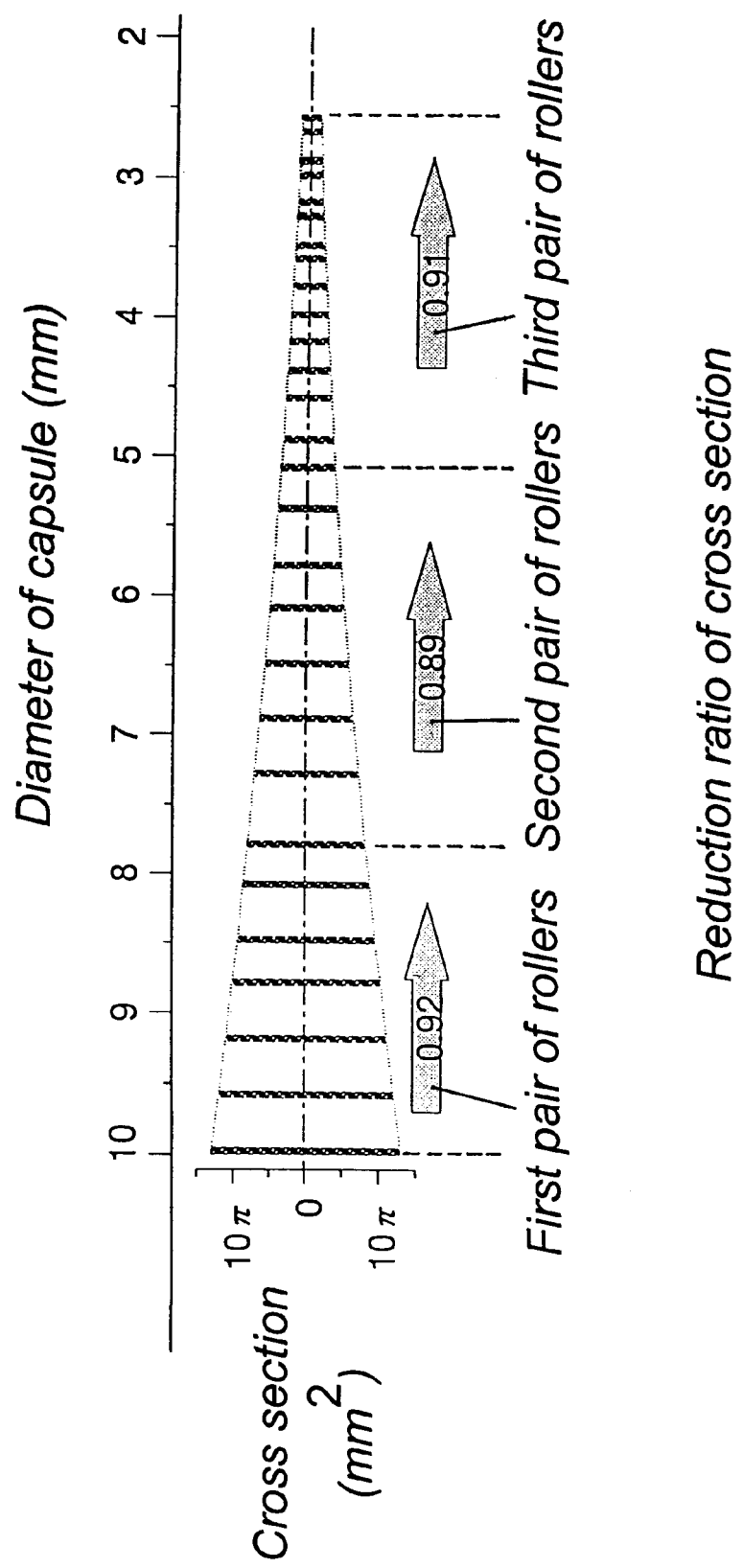
FIG. 9 is a diagram showing results of a second experiment described in the first embodiment.

In a second experiment, as shown in FIG. 9, a rolling operation was performed in a stepwise manner by use of first, second and third pairs of rollers to reduce the cross section of a billet having the original diameter of 10 mm. The first pair of rollers provide six rolling stages. An average reduction ratio of cross section of the billet in the six rolling stages is 0.92. The second pair of rollers provide seven rolling stages. An average reduction ratio of cross section of the billet in the seven rolling stages is 0.89. The third pair of rollers provide fourteen rolling stages. An average reduction ratio of cross section of the billet in the fourteen rolling stages is 0.91. Thus, when using the small reduction ratio of cross section of the billet in each of the rolling stages, it is possible to achieve a large total reduction ratio ($\alpha$) of cross section of the billet without the failure of the capsule, as shown in FIG. 9.

Third and fourth experiments were performed to show the effect of an annealing treatment performed during the forming operation with respect to each of P-type and N-type thermoelectric-element materials. In the third experiment, a rolling operation was performed in a stepwise manner by use of first, second and third pairs of rollers at a rolling speed of 2 m/min to reduce the cross section of a billet having the original diameter of 10 mm. The first pair of rollers provide three rolling stages. An average reduction ratio of cross section of the billet in the three rolling stages is 0.93. The second pair of rollers provide seven rolling stages. An average reduction ratio of cross section of the billet in the seven rolling stages is 0.89. The third pair of rollers provide four rolling stages. An average reduction ratio of cross section of the billet in the four rolling stages is 0.89. As shown in Table 1, when performing the above rolling operation without the annealing treatment, a failure of the capsule was observed after the initial three rolling stages with the third pair of rollers.

In the fourth experiment, as shown in Table 2, an annealing treatment was performed at a timing during the seven rolling stages with the second pair of rollers. That is, immediately after the initial three rolling stages with the second pair of rollers, the annealing treatment was performed to the billet at 345° C. for 10 minutes. An average reduction ratio of cross section of the billet in the initial three rolling stages with the second pair of rollers is 0.87. After the annealing treatment, the rest four rolling stages with the second pair of rollers and the four rolling stages with the third pair of rollers were performed. An average reduction ratio of the rest four rolling stages with the second pair of rollers is 0.91. In this case, the rolling operation was successfully finished without the failure of the capsule. Although the present invention does not necessarily require the annealing treatment, it would be understood from the above experimental results that the annealing treatment is effective to stably finish the forming operation without the failure of the capsule.

STEPS 14 and 15

After the forming operation of the step 13, a heat treatment is performed to the formed billet 6 to sinter the green compact 7 of the ingot bar crushed by the forming operation in the capsule (STEP 14). For example, a normal sintering can be performed as the heat treatment at a temperature of about 400° C. to 450° C. for about 15 hours in an inert-gas atmosphere. Alternatively, a hot isostatic pressing (HIP) may be carried out at about 400° C. for about 1.5 hours in the inert-gas atmosphere. By this heat treatment, the mechanical strength of the thermoelectric element is remarkably improved as compared with that of the thermoelectric element cut directly from the ingot. Then, the resultant sintered body is removed from the capsule to obtain a rod 8 of the sintered body having a desired diameter.

The followings are experimental results of comparing the thermoelectric elements produced by the method of the present invention with those produced by a conventional method. In the conventional method, an ingot bar of the N-type thermoelectric-element material prepared by means of unidirectional solidification was previously ball-milled to obtain a powder thereof. After the powder was charged into a capsule, and the degassing of the capsule was performed to obtain a billet, a forming operation was performed at a reduction ratio. By repeating the above procedure, a plurality of the formed billets were obtained. Next, heat treatments were performed to the formed billets at different heat-treatment temperatures in the range of 300° C. to 450° C. for 10 hours by the normal sintering. Resultant sintered bodies were removed from the capsules to obtain sintered rods of the N-type thermoelectric-element material. The thermoelectric elements were cut from the sintered rods.

Figure 10:
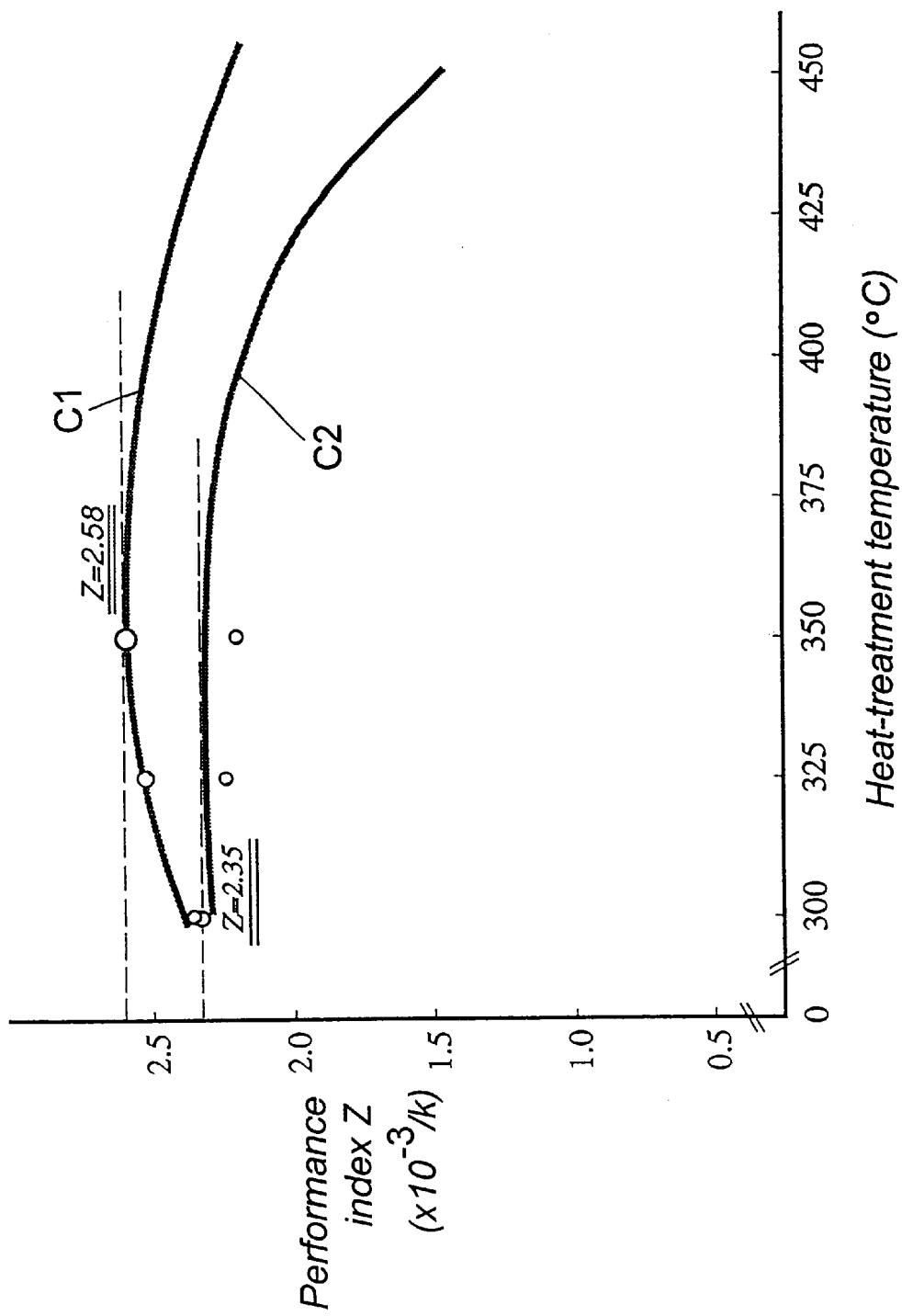
FIG. 10 is a graph showing the relationship between performance index of thermoelectric element and heat-treatment temperature.

In the present method, the ingot bar of the N-type thermoelectric-element material prepared by the unidirectional solidification was encased in a capsule of the same material and shape as that used in the conventional method without grinding the ingot bar such that a direction of the solidification of the ingot bar is substantially agreement with the axial direction of the capsule. The subsequent steps performed to obtain the thermoelectric elements are the same as the conventional method. Therefore, duplicate explanations are omitted. FIG. 10 is a graph showing the relationship between performance index and the heat-treatment temperature. As readily understood from this graph, the performance index (C1: Zmax=2.58) representing the thermoelectric performance of the thermoelectric element produced by the present method is higher than the index (C2: Zmax=2.35) produced by the conventional method over the range of heat-treatment temperature used.

In the present method, since the green compact of the ingot bar crushed by the forming operation in the capsule is sintered, while the orientation of the "C" crystal plane of the ingot bar being substantially maintained, it is possible to provide a sintered body of the thermoelectric-element material having excellent thermoelectric performance, as compared with the case of charging a previously- prepared powder of the thermoelectric-element material having random orientations of the "C" crystal plane into the capsule. In addition, since the formation of the green compact of the ingot is achieved in the capsule during the forming operation without exposure to the air, it is possible to avoid the contamination of the thermoelectric-element material with ball materials used in the ball-mill step of the conventional method, and oxidation of the thermoelectric-element material, and minimize amounts of the impurities trapped in the thermoelectric element. Therefore, the sintered body of the thermoelectric-element material produced by the present method exhibits good mechanical strength to increase yields of the material for thermoelectric element. Consequently, the present invention can provide the sintered body of the thermoelectric-element material suitable to manufacture a thermoelectric module with a high degree of reliability and improved cooling efficiency.

By the way, when the capsule 2 is made of a steel material such as a carbon steel (S15CK, JIS) having a smaller coefficient of linear expansion than the thermoelectric-element material used, there is the following advantage in the heat treatment. For example, a coefficient of linear expansion of the carbon steel (S15CK) is $11.8 \times 10^{-6}/°$ C. Coefficients of linear expansion of a P-type thermoelectric-element material are $13.6 \times 10^{-6}/°$ C. in the orientation of the "C" crystal plane, and $21.0 \times 10^{-6}/°$ C. in a direction normal to the orientation of the "C" crystal plane. On the other hand, coefficients of linear expansion of a N-type thermoelectric-element material are $14.5 \times 10^{-6}/°$ C. in the orientation of the "C" crystal plane, and $19.4 \times 10^{-6}/°$ C. in a direction normal to the orientation of the "C" crystal plane. Thus, when the coefficient of linear expansion of the capsule of the carbon steel is smaller than the coefficients of the P-type and N-type thermoelectric-element materials, the thermoelectric-element material receives compression in the capsule during the heat treatment because the volume expansion of the thermoelectric-element material happens in the carbon-steel capsule having the smaller volume expansion. As a result, the sintering of the thermoelectric-element material in the capsule by the heat-treatment is enhanced, so that a sintering effect similar to the hot press or HIP can be obtained by the normal sintering.

As an example, an ingot bar of the thermoelectric-element material was encased in a carbon-steel (S15CK) capsule to obtain a billet. A swaging operation was performed to the billet to prepare a formed billet having a green compact of the ingot bar crushed by the swaging operation in the capsule. Then, a normal sintering was performed as the heat treatment to sinter the green compact in the capsule. Table 3 shows properties of the green compact and the resultant sintered body. As understood from Table 3, the green compact was perfectly sintered by the normal sintering, and the resultant sintered body exhibits high bending strength and performance index Z.

TABLE 3

| Properties | green compact obtained by swaging operation | sintered body |
|---|---|---|
| density (%) | 94.9 | 100.0 |
| bending strength (kg/mm$^2$) | 0.50 | 6.67 |
| performance index Z (x 10$^{-3}$/K) | 0.62 | 2.58 |
| Seebeck's coefficient ($\mu$V/K) | −211.1 | −188.7 |
| specific resistance (m$\Omega \cdot$ cm) | 8.62 | 1.01 |
| thermal conductivity (W/mK) | 0.83 | 1.37 |

Finally, the sintered body produced according to the method of the first embodiment of the present invention is characterized in that an oxygen content in the sintered body is low, as understood from the following measurement results. That is, the oxygen content in the ingot prepared by the unidirectional solidification is about 35 wtppm. The oxygen content in the sintered body produced by the present method is about 60 wtppm. On the other hand, the oxygen content in a sintered body produced according to the conventional method, which is characterized by the step of charging a powder of the ingot into the capsule, is about 215 wtppm. These measurement results indicate that the method of the present invention is effective to reduce to a minimum the oxygen content in the sintered body. The reduced oxygen content brings about excellent thermoelectric performance and mechanical strength of the sintered body of the material for thermoelectric element.

Second Embodiment

A method of producing a sintered body of a material for thermoelectric element according to the second embodiment of the present invention is substantially equal to that of the first embodiment except for the following features. Therefore, duplicate explanations are omitted. First, an ingot bar of each of P-type and N-type thermoelectric-element materials such as $Sb_2Te_3$ and $Bi_2Te_3$ are prepared. In this embodiment, it is particularly preferred to use the ingot bar prepared by means of unidirectional solidification such that the orientation of the "C" crystal plane of the thermoelectric-element material is in agreement with a direction of the solidification, i.e., an axial direction of the ingot bar.

Next, the ingot bar is ground to obtain a flake-like powder of the thermoelectric-element material. For example, the ingot may be ball-milled in a non-oxidation atmosphere to obtain the powder thereof. Since the "C" crystal plane of the thermoelectric-element material is the cleavage plane, the grinding of the ingot easily proceeds along the "C" crystal plane. The obtained flake-like powder is in random orientations of the "C" crystal plane. If necessary, a dopant may be added to the powder.

Figure 11A:
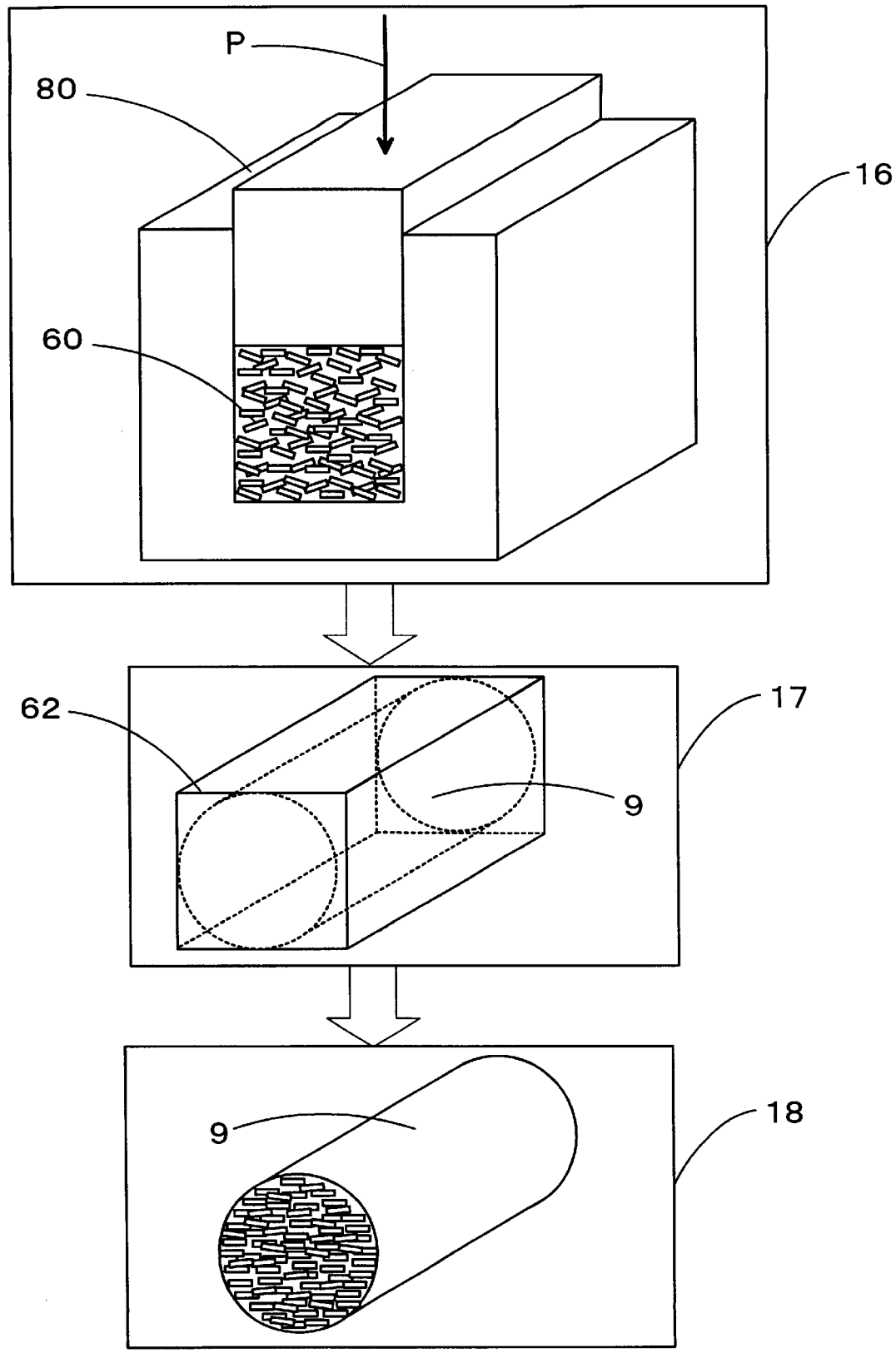
FIG. 11A is a flowchart of a process of preparing a pellet of a material for thermoelectric element according to a second embodiment of the present invention.

Next, as shown in FIG. 11A (STEP 16), a pre-sintered body 62 of the thermoelectric-element material is prepared by hot-pressing the flake-like powder 60 in a non-oxidation atmosphere with use of a hot-pressing apparatus 80. During the hot-pressing step, particles of the flake-like powder are rearranged, so that the pre-sintered body has an orientation of the "C" crystal plane in the horizontal direction normal to the press direction P. Alternatively, the pre-sintered body may be prepared by press-molding the powder to obtain a green compact, and then pre-sintering the green compact in the non-oxidation atmosphere by means of normal sintering.

Figure 11B:
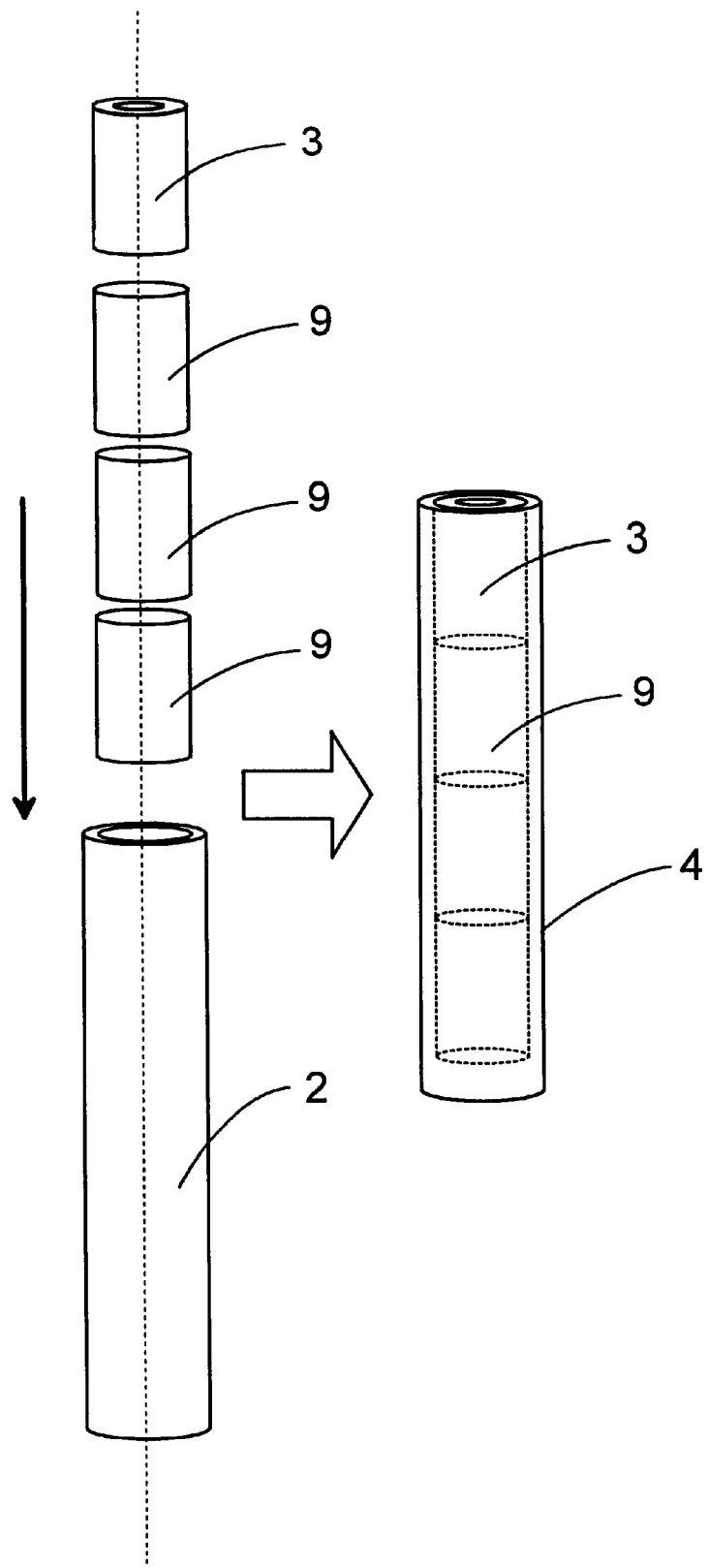
FIG. 11B is a perspective view showing a step of encasing pellets into a capsule according to the second embodiment.
Figure 12A:
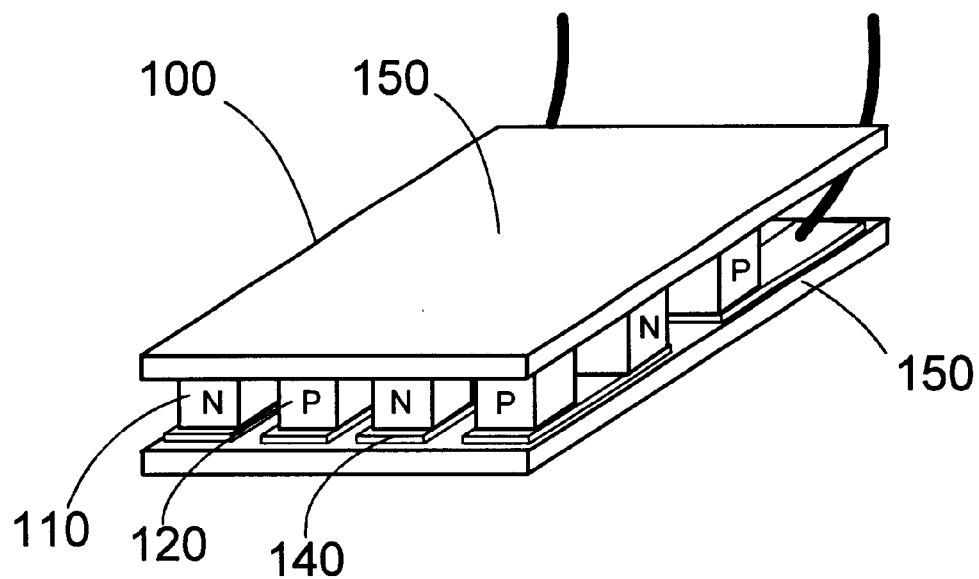
FIGS. 12A and 12B are perspective and cross-sectional views of a conventional thermoelectric module.
Figure 12B:
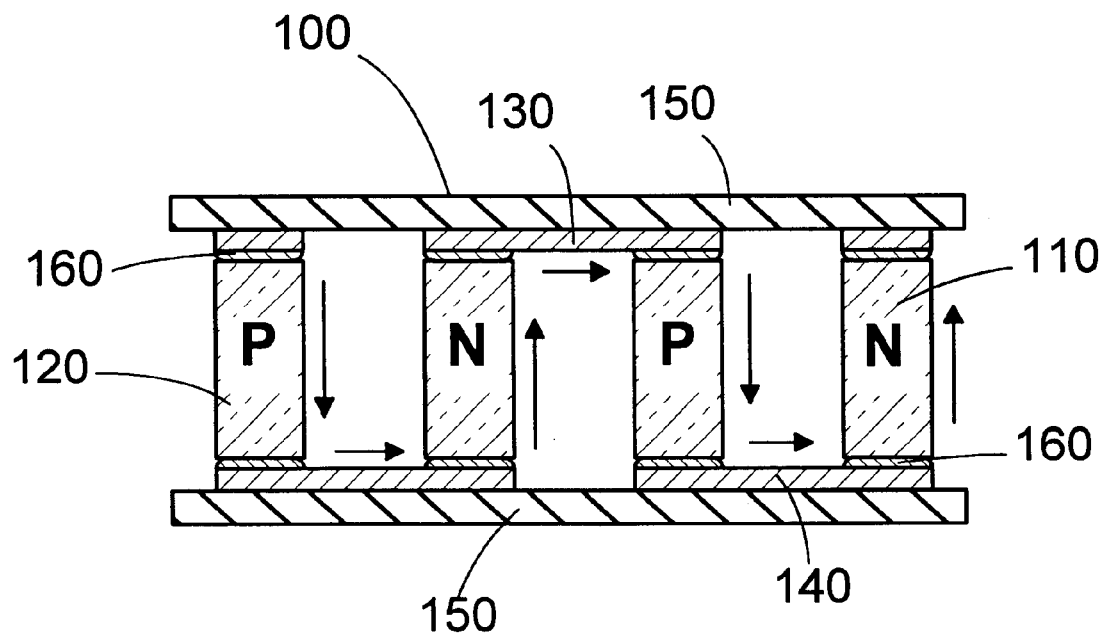
Figure 13:
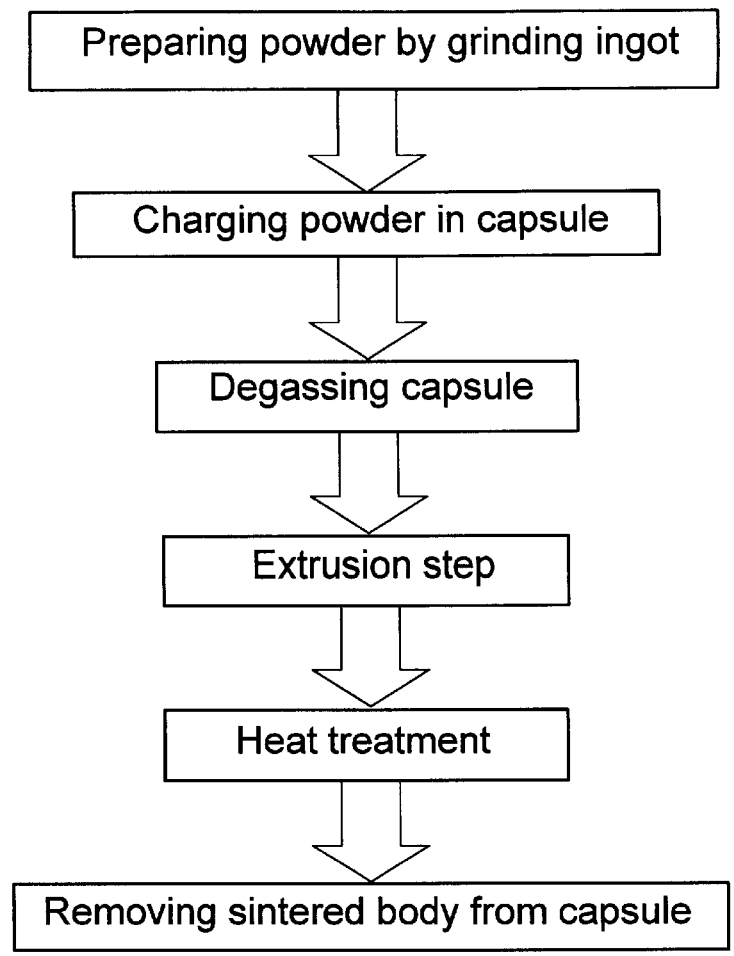
FIG. 13 is a flowchart of a conventional method of producing a sintered body of a material for thermoelectric element.
Figure 14:
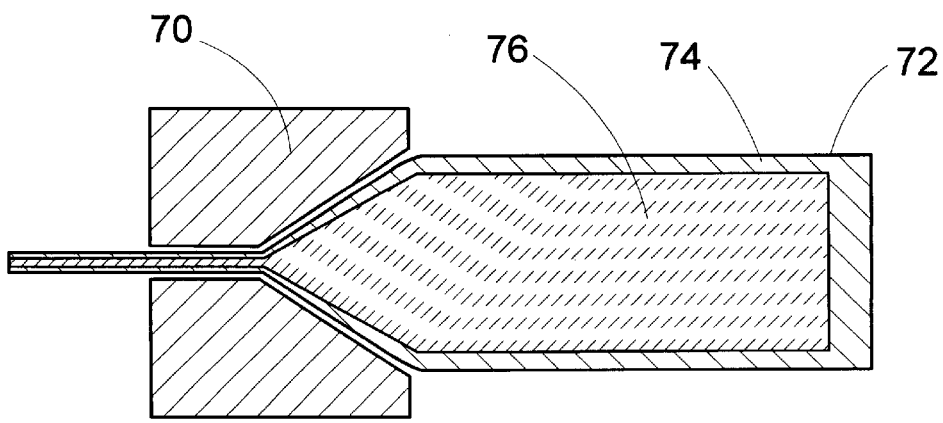
FIG. 14 is a schematic view showing an extrusion step of the conventional method.

Next, as shown in FIG. 11A (STEPS 17 and 18), the pre-sintered body 62 is machined to prepare a pellet 9 such that an axial direction of the pellet is in agreement with the orientation of the "C" crystal plane. By repeating the above procedure, a plurality of pellets 9 can be obtained. The pellets 9 of the pre-sintered bodies are encased in an elongate capsule 2 such that the axial direction of the pellet is in agreement with an axial direction of the capsule, as shown in FIG. 11B. When the spacers 5 shown in FIG. 4A are used, it is possible to encase the pre-sintered body obtained by the step 16 in the capsule 2 without the machining step described above. After covering the capsule 2 with a lid 3, the degassing of the capsule is performed to obtain a billet 4.

Next, a forming operation is performed to the billet to reduce the cross section perpendicular to the axial direction of the billet. As the forming operation, it is preferred to use the bar drawing (FIG. 5), rolling (FIGS. 6A and 6B) or swaging operation (FIGS. 7A and 7B), as explained in the first embodiment. For example, when the bar drawing is performed to the billet, the pellets of the pre-sintered bodies are crushed in the capsule. The crushing of the pellets 9 easily proceeds along the "C" crystal plane of the thermoelectric-element material. In addition, a flow of particles of the crushed pellets happens in the capsule during the drawing operation, so that the degree of orientation of the "C" crystal plane is improved. By performing the drawing operation in a stepwise manner, the degree of orientation of the "C" crystal plane can be further improved. Thus, a green compact of the pellets crushed in the capsule by the forming operation is obtained. As described in the first embodiment, if necessary, an annealing treatment may be performed during the forming operation to avoid the failure of the capsule.

Next, a heat treatment is performed to the formed billet to sinter the green compact in the capsule. A resultant sintered body is removed from the capsule to obtain a sintered rod of the thermoelectric-element material.

Thus, when preparing the pellets according to the mechanical alloying process described above from the ingot of the thermoelectric-element material, and encasing the pellets into the capsule in place of a powder of the ingot, it is possible to provide the sintered body of the thermoelectric-element material suitable to manufacture a thermoelectric module with a high degree of reliability and improved cooling efficiency. In addition, the method of the second embodiment is useful when the sintered body of the thermoelectric-element material having a larger diameter than the original diameter of the ingot used is required.

TABLE 1

| rolling operation | | original size | first pair of rollers (3 stages) | second pair of rollers (7 stages) | third pair of rollers (4 stages) |
|---|---|---|---|---|---|
| capsule diameter (mm) | | φ 10 | □ 7.9 × 8.0 | □ 5.1 × 5.4 | □ 4.3 × 4.5 |
| cross section (mm$^2$) | | 78.54 | 63.20 | 27.54 | 19.35 |
| average reduction ratio of cross section | | — | 0.93 | 0.89 | 0.89 |
| P-type thermoelectric-element material | ingot diameter (mm) | φ 7.00 | □ 5.6 × 5.7 | □ 3.6 × 3.8 | A failure of capsule occurred at the initial 3 stages. |
| | total length (mm) | 100 | 125 | 285 | |
| | wall thickness of capsule (min) | 1.50 | 1.15 | 0.75 | |
| N-type thermoelectric-element material | ingot diameter (mm) | φ 7.00 | □ 5.6 × 5.7 | □ 3.6 × 3.8 | A failure of capsule occurred at the initial 3 stages. |
| | total length (mm) | 100 | 125 | 285 | |
| | wall thickness of capsule (mm) | 1.50 | 1.15 | 0.75 | |

TABLE 2

| rolling operation | | original size | first pair of rollers (3 stages) | second pair of rollers (total 7 stages) | | | third pair of rollers (4 stages) |
|---|---|---|---|---|---|---|---|
| | | | | 3 stages | | 4 stages | |
| capsule diameter (mm) | | φ10 | □ 7.9 × 8.0 | □ 6.3 × 6.5 | Anneal treatment 345° C. 10 min | □ 5.1 × 5.4 | □ 4.3 × 4.5 |
| cross section (mm$^2$) | | 78.54 | 63.20 | 40.95 | | 27.54 | 19.35 |
| average reduction ratio of cross section | | — | 0.93 | 0.87 | | 0.91 | 0.89 |
| P-type thermoelectric-element material | ingot diameter (mm) | φ7.00 | □ 5.6 × 5.7 | □ 4.5 × 4.6 | | □ 3.6 × 3.8 | □ 3.0 × 3.2 |
| | total length (mm) | 100 | 126 | 195 | | 282 | 390 |
| | wall thickness of capsule (mm) | 1.50 | 1.15 | 0.90 | | 0.75 | 0.65 |
| N-type thermoelectric-element material | ingot diameter (mm) | φ7.00 | □ 5.6 × 5.7 | □ 4.5 × 4.6 | | □ 3.6 × 3.8 | □ 3.0 × 3.2 |
| | total length (mm) | 100 | 127 | 190 | | 280 | 395 |
| | wall thickness of capsule (mm) | 1.50 | 1.15 | 0.70 | | 0.75 | 0.65 |

What is claimed is:

1. A method of producing a sintered body of a material for thermoelectric element, said method comprising the steps of:

providing a block of the material for thermoelectric element, said block having an electric-current passing direction, in which electricity is supplied to obtain a desired thermoelectric performance of the thermoelectric element;

encasing said block in an elongate capsule such that the electric-current passing direction of said block is substantially agreement with an axial direction of said capsule;

degassing said capsule;

performing a forming operation for reducing a cross section perpendicular to the axial direction of said capsule to obtain a formed capsule having a green compact of said block crushed by said forming operation therein; performing a heat treatment to sinter said green compact in the formed capsule; and removing the sintered body from the formed capsule.

2. The method as set forth in claim 1, wherein said capsule is made of a metal material having a lower coefficient of linear expansion than the material for thermoelectric element over a temperature range for the heat-treatment.

3. The method as set forth in claim 1, wherein said forming operation is performed by swaging.

4. The method as set forth in claim 1, wherein said forming operation is performed by rolling.

5. The method as set forth in claim 1, wherein said forming operation is performed by means of drawing.

6. The method as set forth in claim 1, wherein said forming operation is performed in a stepwise manner to obtain the formed capsule having a desired cross section.

7. The method as set forth in claim 6, wherein an annealing treatment is performed during said forming operation.

8. The method as set forth in claim 1, wherein said block is of a round-bar shape, and said capsule is configured such that said block fits into said capsule.

9. The method as set forth in claim 1, wherein said block is of a rectangular-solid shape, and said capsule is configured such that a cylinder assembly composed of said block and spacers fits into said capsule.

10. A method of producing a sintered body of a material for thermoelectric element, said method comprising the steps of:

providing an ingot of the material for thermoelectric element prepared by means of unidirectional solidification;

encasing said ingot in an elongate capsule such that a direction of the solidification of said ingot is substantially agreement with an axial direction of said capsule;

degassing said capsule;

performing a forming operation for reducing a cross section perpendicular to the axial direction of said capsule to obtain a formed capsule having a green compact of said ingot crushed by said forming operation therein;

performing a heat treatment to sinter said green compact in the formed capsule; and removing the sintered body from the formed capsule.

11. A method of producing a sintered body of a material for thermoelectric element, said method comprising the steps of:

preparing a pre-sintered body having an axial direction, in which a specific crystal plane of the material for thermoelectric element is substantially oriented;

encasing said pre-sintered body in an elongate capsule such that the axial direction of said pre-sintered body is agreement with an axial direction of said capsule;

degassing said capsule;

performing a forming operation for reducing a cross section perpendicular to the axial direction of said capsule in a stepwise manner to obtain a formed capsule having a green compact of said pre-sintered body crushed by said forming operation therein;

performing a heat treatment to sinter said green compact in the formed capsule; and removing the sintered body from the formed capsule.

12. The method as set forth in claim 11, wherein said pre-sintered body is prepared by grinding an ingot of the material for thermoelectric element prepared by means of unidirectional solidification to obtain a powder thereof, and hot-pressing the powder in a non-oxidation atmosphere.

* * * * *